(12) United States Patent
Tseng et al.

(10) Patent No.: US 6,190,982 B1
(45) Date of Patent: Feb. 20, 2001

(54) METHOD OF FABRICATING A MOS TRANSISTOR ON A SEMICONDUCTOR WAFER

(75) Inventors: Hua-Chou Tseng; Chien-Ting Lin, both of Hsin-Chu (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/492,670

(22) Filed: Jan. 28, 2000

(51) Int. Cl.[7] .................................................. H01L 21/336
(52) U.S. Cl. .............................................. 438/305; 438/230
(58) Field of Search .................................... 438/299, 305, 438/197, 230, 301, 303

(56) References Cited

U.S. PATENT DOCUMENTS

| | | | |
|---|---|---|---|
| 5,736,446 | * | 4/1998 | Wu ......................................... 438/305 |
| 5,858,843 | * | 1/1999 | Doyle et al. ........................... 438/299 |
| 6,074,923 | * | 7/2000 | Lee ......................................... 438/305 |
| 6,083,783 | * | 7/2000 | Lin et al. ............................... 438/199 |
| 6,096,591 | * | 8/2000 | Gardner et al. ....................... 438/238 |
| 6,100,148 | * | 8/2000 | Gardnet et al. ....................... 438/305 |

\* cited by examiner

*Primary Examiner*—Matthew Smith
*Assistant Examiner*—Robert A. Hullinger
(74) *Attorney, Agent, or Firm*—Winston Hsu

(57) ABSTRACT

The present invention relates to a method of fabricating a MOS transistor on a semiconductor wafer. The semiconductor wafer comprises a silicon substrate. A gate is first formed in a predetermined area on the surface of the semiconductor wafer. A first ion implantation process is then performed to form a doped area on the surface of the silicon substrate adjacent to the gate, the doped area serving as a heavily doped drain (HDD). A uniform and oxygen-free dielectric layer is formed on the surface of the semiconductor wafer that covers the gate. A spacer is formed on each wall of the gate. Finally, a second ion implantation process is performed to form a source and a drain on the surface of the silicon substrate adjacent to the spacer.

14 Claims, 4 Drawing Sheets

METHOD OF FABRICATING A MOS TRANSISTOR ON A SEMICONDUCTOR WAFER

BACKGROUND OF THE INVENTION

1. Field of the Invention

The present invention relates to a method of fabricating a MOS transistor on a semiconductor wafer.

2. Description of the Prior Art

As the density of integration of semiconductor devices increases, complementary metal-oxide-semiconductor (CMOS) transistors have gradually taken the place of N-type metal-oxide-semiconductors (NMOS) in recent years. The CMOS transistor is typically composed of one PMOS transistor and one NMOS transistor. A PMOS transistor comprises a gate, a P-type source and drain (S/D) and an N-type silicon substrate.

Boron is generally used as a dopant in the prior art method to form a heavily doped drain (HDD) and an S/D region. However, owing to the small atomic volume of boron, the phenomenon of out diffusion is usually observed after using boron in an ion implantation process. Boron out diffusion effects will seriously influence the electrical properties of the MOS transistor, especially when the design line width is less than 0.18 micrometers or even less than 0.15 micrometers. In addition, using a silicon dioxide layer as an etching stop layer when forming spacers in the prior art method also results in oxide-enhanced diffusion (OED) effects during the ion implantation process. Furthermore, the silicon dioxide layer will increase the rate of boron out diffusion and decrease the boron concentration in the HDD. Consequently, there is a need to improve the manufacturing process of forming the PMOS transistor so as to enhance the quality of the semiconductor products.

Please refer to FIG. 1 to to FIG. 4 FIG. 1 to FIG. 4 are cross-sectional diagrams of the prior art method of fabricating a PMOS transistor 30 on a semiconductor wafer 10. As shown in FIG. 1, the semiconductor wafer 10 comprises a silicon substrate 12, and an N-well 11 on the surface of the silicon substrate 12 isolated by a shallow trench 14. The semiconductor wafer 10 also comprises a gate 22, which is located on the surface of the N-well 11. The gate 22 comprises a dielectric layer 20 located on the N-well 11 and a doped polysilicon layer 21 located on the dielectric layer 20. The dielectric layer 20, composed of silicon dioxide ($SiO_2$), serves as a gate oxide layer of the PMOS transistor 30. The doped polysilicon layer 21 serves as a gate electrode of the PMOS transistor 30.

As shown in FIG. 2, a uniform liner oxide layer 16, composed of silicon dioxide ($SiO_2$), is first formed on the surface of the semiconductor wafer 10. A P$^-$ ion implantation process is then performed to form an HDD 23 on the surface of the silicon substrate 12 adjacent to the gate 22. The dosage of boron in the P$^-$ ion implantation process is about $1\times10^{14}$ to $5\times10^{15}$ atoms/cm$^2$, and the energy of the boron ions is about 10 to 15 KeV. Next, a silicon nitride layer 18 is uniformly formed on the surface of the liner oxide layer 16.

Basically, the liner oxide layer 16 is used as an etching stop layer when forming silicon nitride spacers. It also serves as a buffer layer to release thermal stress produced by the silicon nitride spacers. However, boron has a tendency to diffuse into the liner oxide layer 16. As a result, it is difficult to control the concentration of boron in the HDD 23 in the prior art method. Furthermore, during the P$^-$ ion implantation process, the liner oxide layer 16 causes a serious dosage loss problem and OED effects.

Next, as shown in FIG. 3, a conventional etching back process is used to vertically remove a portion of the silicon nitride layer 18 down to the surface of the liner oxide layer 16. The remaining portion of the liner oxide layer 16 on each wall of the gate 22 becomes a spacer 19. A heavier doping process, or a P$^+$ ion implantation process, is then used to form an S/D 24 of the PMOS transistor 30 on the silicon substrate 12 adjacent to the gate 22. Boron, or boron fluoride ions ($BF_2^+$), with an energy of about 10 KeV and a dosage of about $2\times10^{15}$ to $1\times10^{16}$ atoms/cm$^2$ are usually used in the P$^+$ ion implantation process. Thereafter, an annealing process at a temperature of 1000 to 1050° C. is performed to diffuse the boron ions into the S/D 24 to achieve a desirable profile and to repair the damage done to the silicon substrate 12 from the ion implantation process.

Next, as shown in FIG. 4, a dry etching process is performed to etch the liner oxide layer 16 that is not covered by the spacer 19. Then, a self-aligned silicide (salicide) process is performed. A metal layer (not shown) is first formed on the surface of the semiconductor wafer 10 that covers the gate 22. A thermal process is next used to form a silicide layer 26 on top of the gate 22 and on the surface of the S/D 24. A wet etching process is next used to remove the metal layer thereby completing the PMOS transistor 30.

The liner oxide layer 16 can prevent channeling effects during the P$^-$ ion implantation process and can also prevent damage to the silicon substrate. Unfortunately, the liner oxide layer 16 also causes a serious dosage loss during the P$^-$ ion implantation process, which makes it difficult to precisely control the concentration of boron in the HDD 23. In order to overcome the problem of dosage loss, boron ions with higher energy must be used during the P$^-$ ion implantation process in the prior art method. However, these more energetic ions will result in undesirable deeper junction depths and OED effects, as well as short channel effects. In addition, out diffusion of boron into the liner oxide layer 16 also causes a decrease of the concentration of boron in the HDD 23.

SUMMARY OF THE INVENTION

It is therefore a primary objective of this invention to fabricate a MOS transistor on a semiconductor wafer to solve the above-mentioned problems.

In a preferred embodiment, the present invention relates to a method of fabricating aMOS transistor on a semiconductor wafer. The semiconductor wafer comprises a silicon substrate. The method comprises:

forming a gate in a predetermined area on the surface of the semiconductor wafer;

performing a first ion implantation process to form a doped area on the surface of the silicon substrate adjacent to the gate, the doped area serving as a heavily doped drain (HDD);

forming a uniform and oxygen-free dielectric layer on the surface of the semiconductor wafer that covers the gate;

forming a spacer on each wall of the gate; and performing a second ion implantation process to form a source and a drain on the surface of the silicon substrate adjacent to the spacer.

It is an advantage of the present invention that the method of fabricating a PMOS transistor on a semiconductor wafer can prevent dosage losses and deep junction depths because a liner oxide layer is not used in the HDD formation process.

Furthermore, the oxygen-free dielectric layer can prevent both OED effects and the loss of boron from the HDD.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
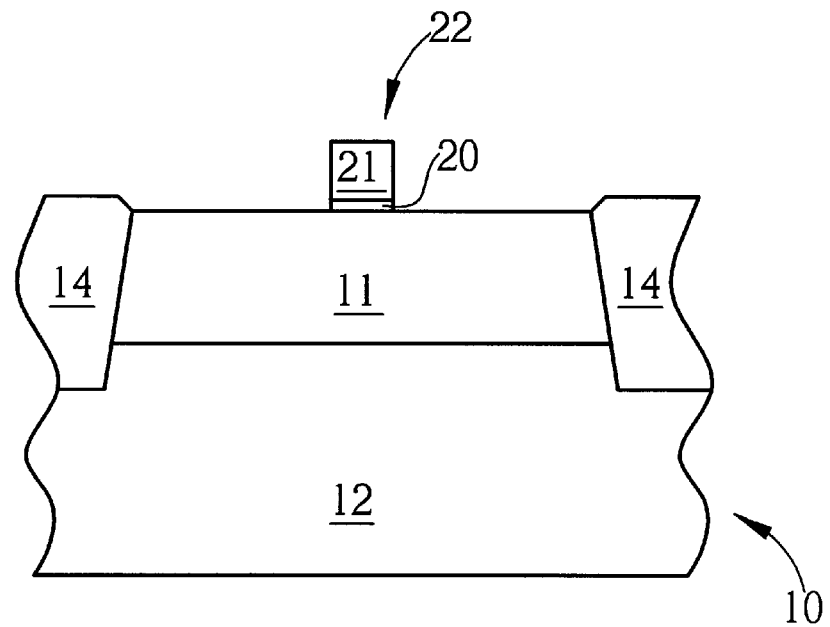
FIG. 1 to FIG. 4 are cross-sectional diagrams of the prior art method of fabricating a PMOS transistor on a semiconductor wafer.
Figure 2:
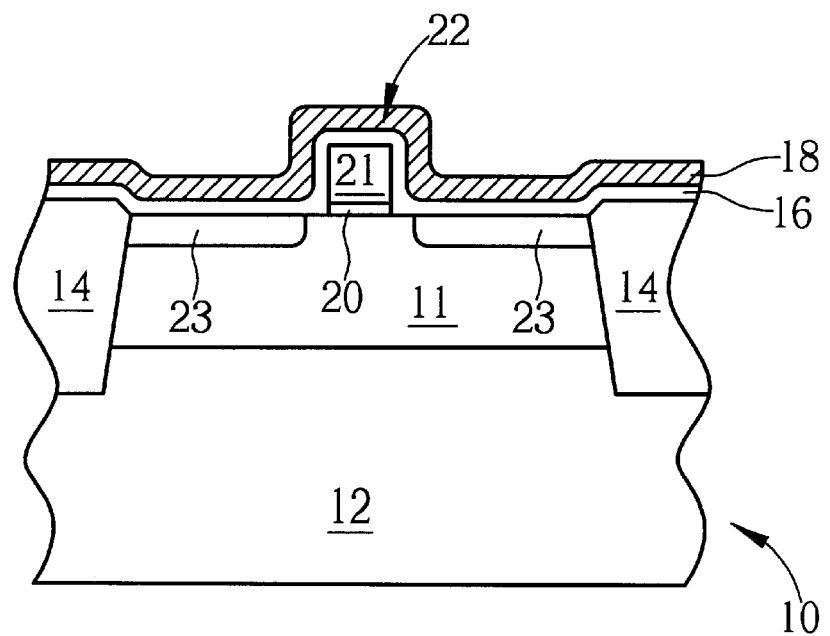
Figure 3:
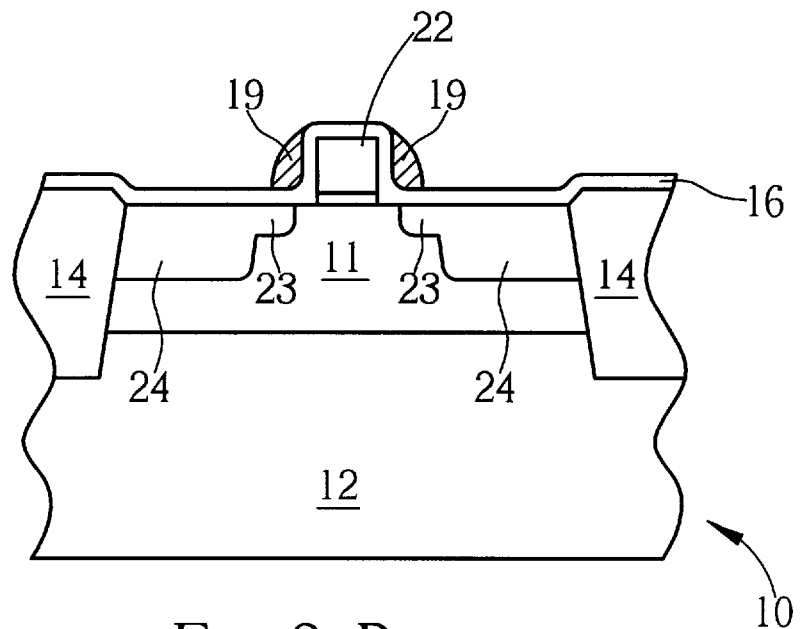
Figure 4:
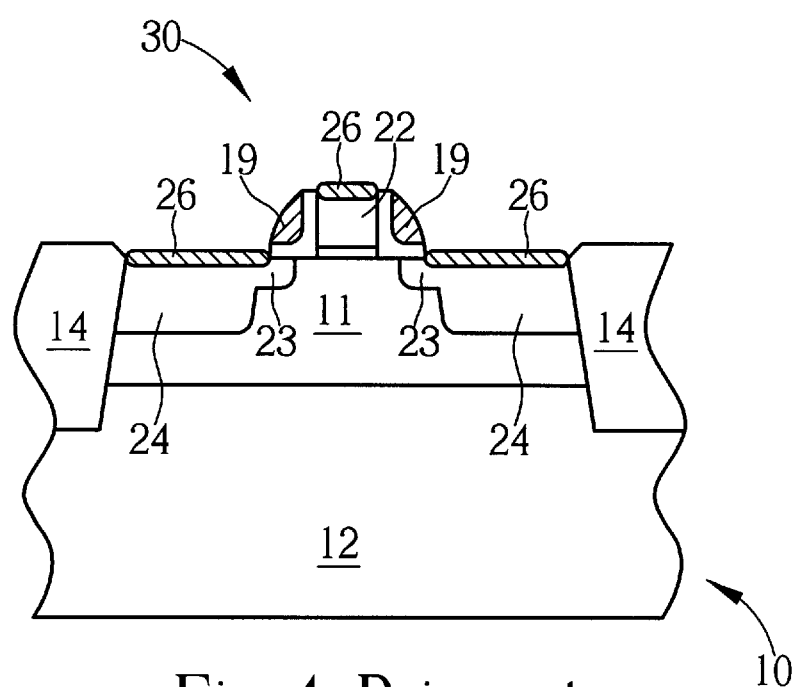
Figure 5:
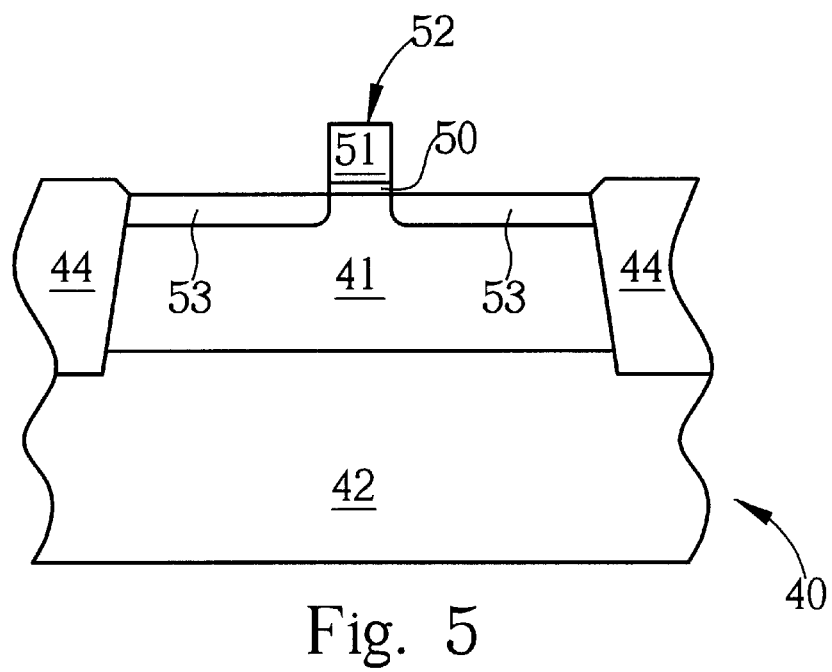
FIG. 5 to FIG. 8 are cross-sectional diagrams of the present invention method of fabricating a MOS transistor on a semiconductor wafer.
Figure 7:
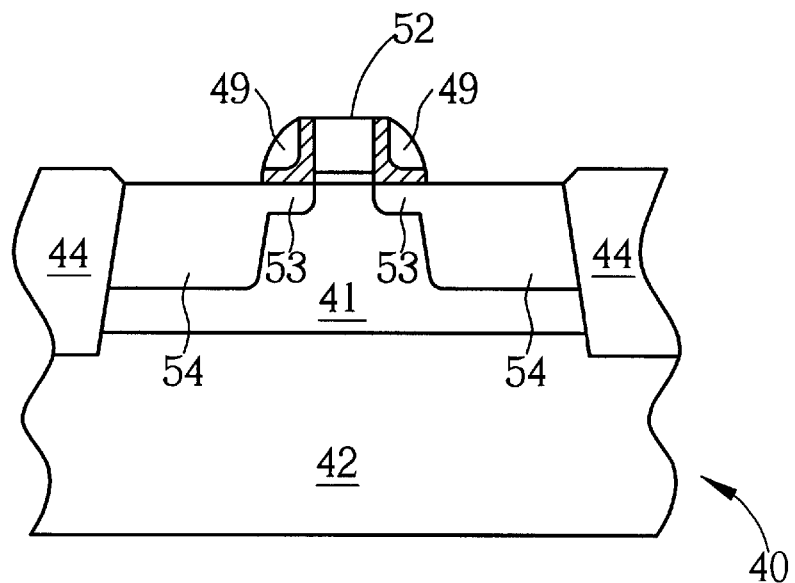
Figure 8:
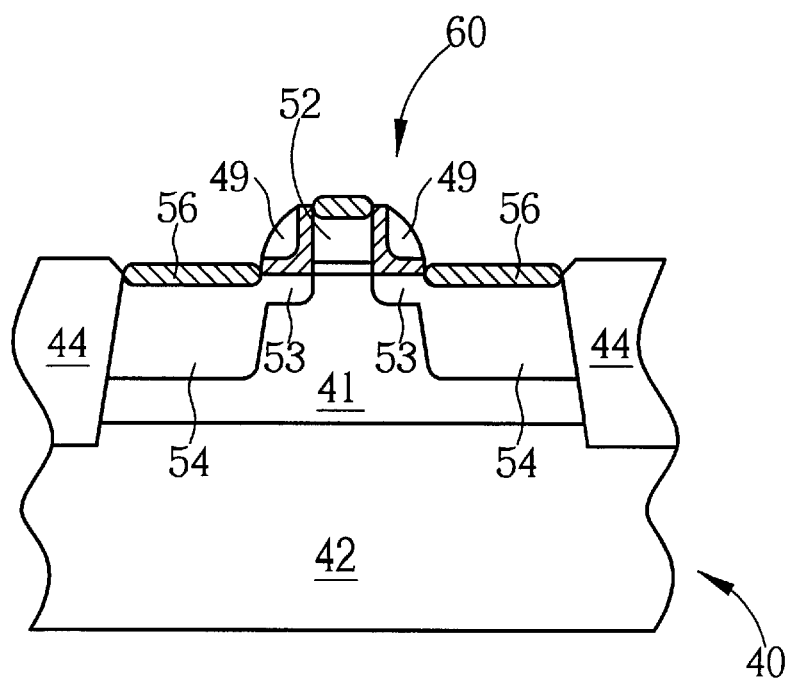

Please refer to FIG. 5 to to FIG. 8. FIG. 5 to FIG. 8 are cross-sectional diagrams of the present invention method of fabricating a MOS transistor 60 on a semiconductor wafer 40. As shown in FIG. 5, the semiconductor wafer 40 comprises a silicon substrate 42 and an N-well 41 on the surface of the silicon substrate 42, the N-well 41 isolatedbya shallow trench 44. Agate 52 is first formed on the surface of the N-well 41. The gate 52 comprises a dielectric layer 50 located on the N-well 41 and a doped polysilicon layer 51 located on the dielectric layer 50. The dielectric layer 50, composed of silicon dioxide ($SiO_2$), serves as a gate oxide layer of the MOS transistor 60. The doped polysilicon layer 51 serves as a gate electrode of the MOS transistor 60. A boron ion implantation process is then performed to form an HDD 53 on the silicon substrate 42 adjacent to the gate 52.

Figure 6:
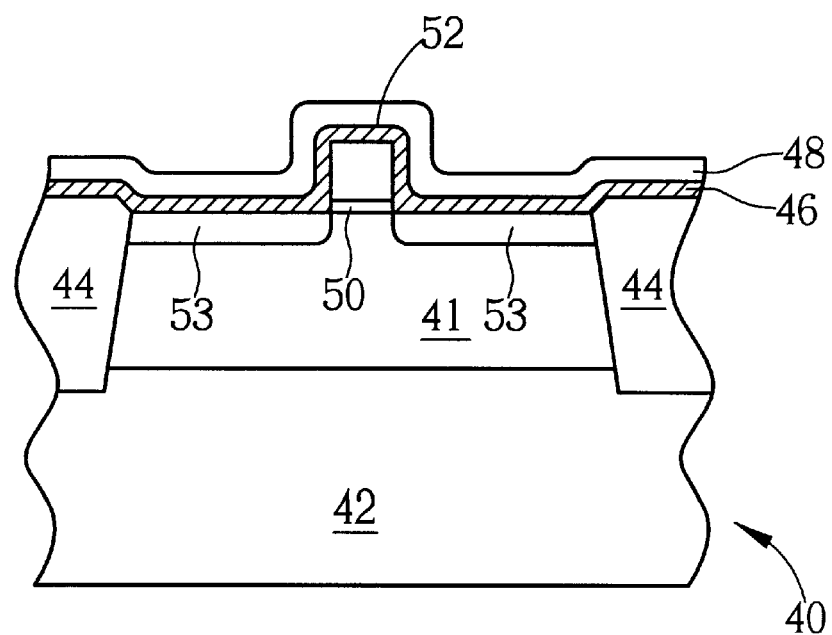

Next, as shown in FIG. 6, a uniform silicon nitride layer 46, which covers the N-well 41 and the gate 52, is formed on the surface of the semiconductor wafer 40. The thickness of the silicon nitride layer 46 is about 40 to 100 angstroms. A conventional chemical vapor deposition (CVD) process is then used to form a silicon oxide layer 48 over the silicon nitride layer 46.

Next, as shown in FIG. 7, an anisotropic dry etching process is performed to vertically remove a portion of the silicon oxide layer 48 and silicon nitride layer 46 down to the surface of the N-well 41. The remaining portion of the silicon oxide layer 48 and the silicon nitride layer 46 on each wall of the gate 52 forms a spacer 49. Then, a $P^+$ ion implantation process is performed to form an S/D 54 on the surface of the N-well 41 adjacent to the spacer 49. Boron or $BF_2^+$ with an energy in a range from about 1 to 10 KeV and a dosage in a range from about $1\times10^{14}$ to $5\times10^{15}$ atoms/$cm^2$ is used as a dopant in the $P^+$ ion implantation process. Subsequently, an annealing process at a temperature of about 1000 to 1050° C. is performed after the $P^+$ ion implantation process.

Next, as shown in FIG. 8, a salicide process is performed to form a tungsten silicide layer ($WSi_x$) 56 on the surface of the S/D 54 and the top of the gate 52. The tungsten silicide layer 56 improves the conductance of the surface of the SID 54 and the gate 52. It should be understood that the tungsten silicide layer 56 can also be replaced by cobalt silicide ($CoSi_2$), titanium silicide ($TiSi_2$) or molybdenum silicide ($MoSi_2$).

In contrast to the prior art method, the present invention method of fabricating a MOS transistor 60 on a semiconductor wafer 40 prevents OED effects because the silicon nitride layer 46 is an oxygen-free dielectric layer. Furthermore, boron ions in the HDD 53 cannot easily diffuse into the silicon nitride layer 46 in the present invention, thus solving the problem of out diffusion of boron.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a metal-oxide-semiconductor (MOS) transistor on a semiconductor wafer, the semiconductor wafer comprising a silicon substrate, the method comprising:

forming a gate in a predetermined area on the surface of the semiconductor wafer;

performing a first ion implantation process to form a doped area on the surface of the silicon substrate adjacent to the gate, the doped area serving as a heavily doped drain (HDD);

forming a uniform and oxygen-free dielectric layer on the surface of the semiconductor wafer that covers the gate;

forming a silicon oxide layer on the surface of the dielectric layer;

performing an anisotropic dry etching process to vertically remove a portion of the silicon oxide layer, a remaining portion of the silicon oxide layer forming a spacer on each wall of the gate; and performing a second ion implantation process to form a source and a drain on the surface of the silicon substrate adjacent to the spacer.

2. The method of claim 1 wherein the gate comprises an insulating layer positioned on the surface of the silicon substrate and a conductive layer positioned on the insulating layer.

3. The method of claim 2 wherein the insulating layer is composed of silicon dioxide ($SiO_2$) acting as a gate oxide layer of the MOS transistor.

4. The method of claim 2 wherein the conductive layer is composed of doped polysilicon.

5. The method of claim 1 wherein the dielectric layer is composed of silicon nitride (SiN) with a thickness of 40 to 100 angstroms (Å).

6. The method of claim 1 wherein the silicon oxide layer and the dielectric layer are vertically etched down to the surface of the silicon substrate in the anisotropic dry etching process.

7. The method of claim 1 wherein boron (B) is used as a dopant in the first ion implantation process.

8. The method of claim 1 wherein after the second ion implantation process the method further comprises a self-aligned silicide (salicide) formation process to form a silicide layer on the surface of the source and the drain and on the top of the gate so as to improve contact conductance.

9. The method of claim 8 wherein the silicide layer is composed of $WSi_x$, $TiSi_2$, $MoSi_2$ or $CoSi_2$.

10. A method of fabricating a PMOS transistor on the surface of a silicon substrate of a semiconductor wafer, the silicon substrate comprising an N-well, the method comprising:

forming a gate in a predetermined area on the surface of the N-well;

performing a boron (B) ion implantation process to form a doped area on the surface of the silicon substrate adjacent to the gate, the doped area serving as a heavily doped drain (HDD);

forming a uniform silicon nitride layer with a thickness of 40 to 100 angstroms on the surface of the semiconductor wafer that covers the gate;

forming a silicon oxide layer on the surface of the silicon nitride layer;

performing an anisotropic dry etching process to vertically remove a portion of the silicon oxide layer, a remaining portion of the silicon oxide layer forming a spacer on each wall of the gate; and performing an ion implantation process to form a source and a drain on the surface of the silicon substrate adjacent to the spacer.

11. The method of claim 10 wherein the gate comprises a silicon dioxide ($SiO_2$) layer positioned on the surface of the N-well acting as a gate oxide layer of the PMOS transistor, and a conductive layer positioned on the silicon dioxide layer acting as a conductive layer of the PMOS transistor.

12. The method of claim 10 wherein the silicon oxide layer and the silicon nitride layer are vertically etched down to the surface of the N-well in the anisotropic dry etching process.

13. The method of claim 10 wherein after the ion implantation process the method further comprises a self-aligned silicide (salicide) formation process to form a silicide layer on the surface of the source and the drain and on the top of the gate so as to improve contact conductance.

14. The method of claim 13 wherein the silicide layer is composed of $WSi_x$, $TiSi_2$, $MoSi_2$ or $CoSi_2$.

* * * * *